United States Patent
Lei et al.

(12) 
(10) Patent No.: US 6,491,205 B1
(45) Date of Patent: Dec. 10, 2002

(54) ASSEMBLY OF MULTI-CHIP MODULES USING EUTECTIC SOLDERS

(75) Inventors: Chon C. Lei, Poughkeepsie, NY (US); Jac A. Burke, Lake Katrine, NY (US); William F. Beausoleil, Hopewell Junction, NY (US); N. James Tomassetti, Kingston, NY (US); Lawrence A. Thomas, West Hurley, NY (US); Tak-kwong Ng, Hyde Park, NY (US); Michael Kessler, Herrenberg (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/960,021

(22) Filed: Sep. 21, 2001

(51) Int. Cl.[7] .............................................. B23K 31/02
(52) U.S. Cl. ........................................ 228/103; 228/256
(58) Field of Search .................... 228/180.21, 56.3, 228/253, 103, 256; 427/96, 282

(56) References Cited

U.S. PATENT DOCUMENTS

| | | | | |
|---|---|---|---|---|
| 5,244,143 A | * | 9/1993 | Ference et al. | 228/180.21 |
| 5,395,040 A | * | 3/1995 | Holzmann | 118/213 |
| 5,468,655 A | * | 11/1995 | Greer | 228/180.22 |
| 5,824,155 A | * | 10/1998 | Ha et al. | 118/406 |
| 6,297,560 B1 | * | 10/2001 | Capote et al. | 257/701 |
| 6,312,974 B1 | * | 11/2001 | Wu et al. | 438/107 |

* cited by examiner

Primary Examiner—M. Alexandra Elve
Assistant Examiner—Jonathan Johnson
(74) Attorney, Agent, or Firm—Lynn L. Augspurger

(57) ABSTRACT

Chips requiring high temperature reflow for attachment to a module substrate are attached first and then a eutectic water soluble solder paste and/or water soluble flux is dispensed on both the TSOP and the PBGA chip pads instead of using the paste screening techniques. The dispensing is done by injecting solder on the solder sites individually. Characteristics of the solder paste used is that it must be fluid enough to be injected onto the individual sites yet have enough body that it remains in place and does not run from site to site once dispensed. A paste capable of providing such characteristics is one having: a ) a very fine particle size in the range of 400 to 500 mesh and preferably between 400 and 450 mesh; b) a low viscosity (below 500 k centerpoise and preferably between 425 to 375 cps); and c) a solid content of 86% or lower and preferably between 84 and 80%. The chips to be joined to the module using low temperature module joining are then placed on the module substrate surface and then put in an oven for reflow to attach these chips to the surface. After the joining process, the modules are cleaned by spraying deionized water on them to remove any flux or solder residues and the modules are electrically tested to determine if the joining process has resulted in connection with the proper mechanical and electrical characteristics.

11 Claims, 4 Drawing Sheets

ASSEMBLY OF MULTI-CHIP MODULES USING EUTECTIC SOLDERS

FIELD OF THE INVENTION

The present invention relates to the soldering of different types of chips to multi-chip module substrates and more particularly to joining to the same substrate of both chips requiring high temperature reflow and materials and/or techniques and those requiring low temperature reflow materials and/or techniques.

BACKGROUND OF THE INVENTION

The joining to the same ceramic module substrate both chips using high temperature reflow techniques, such as CMOS 7S ASIC, C4 flip-chips, and those chips, such as the thin small outline package (TSOP) chips and plastic ball grid array (PBGA) chips, using low temperature reflow techniques is difficult and expensive. First of all, the chip joining of the variuous chips cannot be performed at the very same time because the use of the high temperature reflow techniques for C4 chips would destroy TSOP and/or PBGA chips. In addition, when the high temperature C4 joining process is performed first, upon completion of that process, the chip carrier surface is no longer flat interfering with the use of conventional paste screening processes on TSOP pads. Furthermore, the space between the various chips on the substrate surface is close (in some cases less than 1.5 mm) making paste screening of the eutectic paste with acceptable yields virtually impossible using present pastes.

The modules are expensive and the correction of errors occurring in post C4 chip processing without damaging the module during rework is a serious problem with present rework techniques. First of all, the above mentioned close spacing makes removal of a chip without damaging the chip site and/or adjacent chips or their connections difficult using present chip removal tools and techniques. In addition, solder sucking types of tools are ineffective to remove the solder because of heat that the ceramic absorbs, and traditional copper block dressing techniques do not dress the chip site properly because they do not have enough mass to apply constant pressure to the chip site during the copper dress operation in the furnace.

Therefore, is it an object of the present invention to provide a new method and apparatus of joining different types of chips with different physical characteristics to a common chip carrier surface.

Another object of the present invention is to provide a new method and apparatus for reworking modules populated chips with different physical characteristics.

BRIEF DESCRIPTION OF THE INVENTION

In accordance with the present invention, the chips requiring high temperature reflow for attachment to a module substrate are attached first and then a eutectic water soluble solder paste and/or water soluble flux is dispensed on both the TSOP and the PBGA chip pads instead of using the paste screening techniques. The dispensing is done by injecting solder paste on the solder sites individually. Characteristics of the solder paste used is that it must be fluid enough to be injected onto the individual sites yet have enough body that it remains in place and does not run from site to site once dispensed. A paste capable of providing such characteristics is one having: a) a very fine particle size in the range of 400 to 500 mesh and preferably between 400 and 450 mesh; b) a low viscosity (below 500 k centipoise and preferably between 425 to 375 cps); and c) a solid content of 86% or lower and preferably between 84 and 80%. The chips to be joined to the module using low temperature module joining are then placed on the module substrate surface and then put in an oven for reflow to attach these chips to the surface. After the joining process, the modules are cleaned by spraying deionized water on them to remove any flux or solder residues and the modules are electrically tested to determine if the joining process has resulted in connection with the proper mechanical and electrical characteristics.

When errors are detected during testing in any of the chips mounted on the module with the low temperature joining process, those chips can be removed by attaching a magnetically attracted element to their surface, suspending a magnetic over the chip and the element and then reheating the module to cause reflow of the solder. Upon reflow of the solder, the magnetic lifts the chip with the magnetically attracted element off the surface of the module allowing redressing of the chip site and reuse of the module with a replacement chip.

The use of this magnetic pulling technique eliminates spacing concerns normally encountered with a pulling device. The magnetic pull forces produced are predictable and create a smooth acceleration during separation of the chip from the substrate. This device can also be applied to removing "fine pitch" C4 devices at higher temperatures. As chip footprints increase in size, so does the force that is required to remove the chips. The magnetic pulling has the advantage of a ever-present shearing force which acts on the interconnection only when the solder liquefies. This process can be adapted to present manufacturing auer boats (multiple substrate holders or other reflow fixturing).

Once certain chips, such as PBGA chips, have been removed, a large residual solder volume is left on the ceramic surface. To remove this solder, spring pressure is applied to the top of a copper block to allow the block to fully dress the site. The spring forces are used to assure proper contact between the copper block and the residual solder balls though the solder balls may vary in height to guarantee reducing solder on the module surface to an acceptable level.

DETAILED DESCRIPTION OF THE EMBODIMENTS

Figure 1:
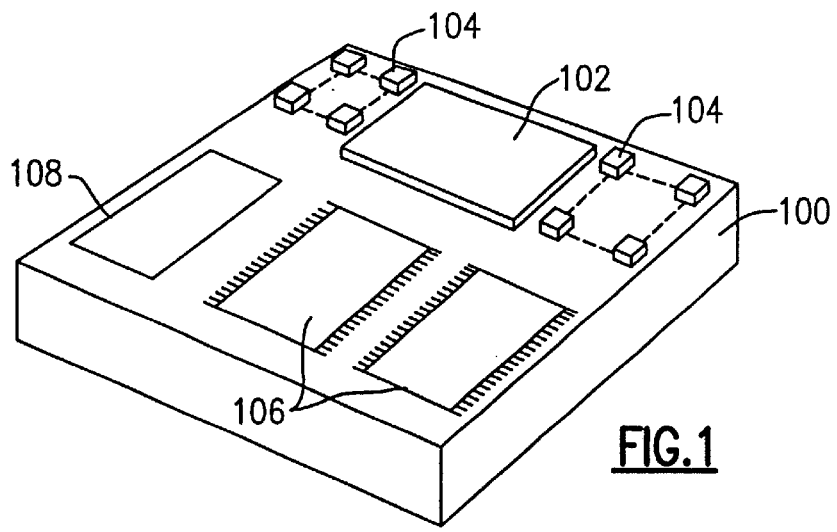
FIG. 1 is a diagram of a type of a multichip module (MCM) with different types of chips and capacitors mounted on it.
Figure 2:
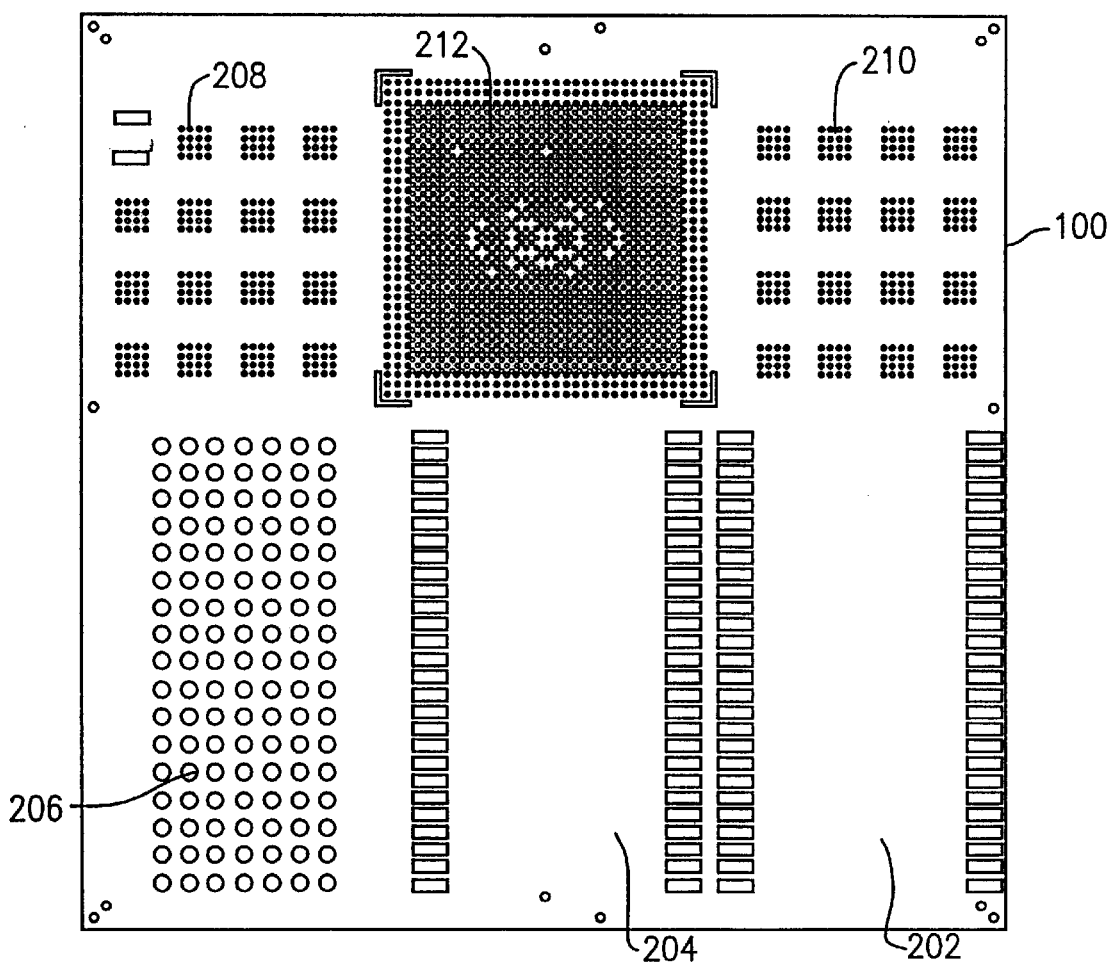
FIG. 2 is a diagram of the top surface of the ceramic module substrate of FIG. 1 without any of the chips or capacitors mounted on it.

Referring now to FIG. 1, a MCM module 100 contains a C4 chip 102 and capacitors 104 associated with the C4 chip. It also contains two TSOP chips 106 and one PBGA chip 108. FIG. 2 shows the topside of an unpopulated view of the module 100 showing the solder sites 202 and 204 for the TSOP chips, solder sites 206 for the PBGA chip, solder sites for the capacitors 208 and 210 and solder sites 212 for the C4 chip.

Figure 3:
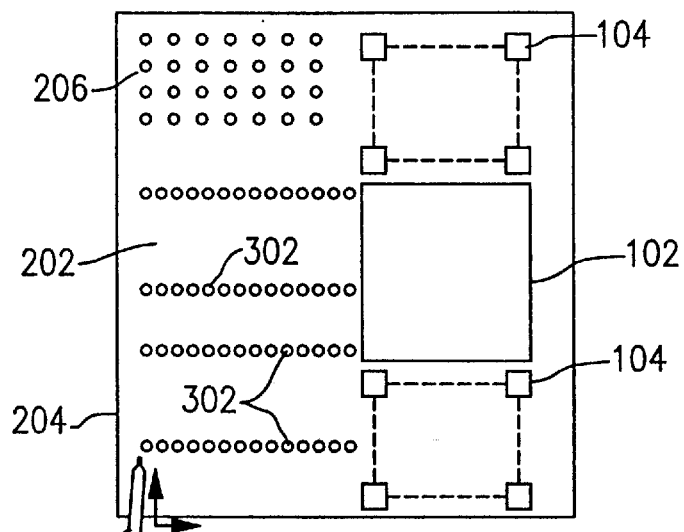
FIG. 3 is a diagram of the top surface of the ceramic module substrate of FIG. 1 with only the C4 chip and associated capacitors in position on the module.
Figure 4:
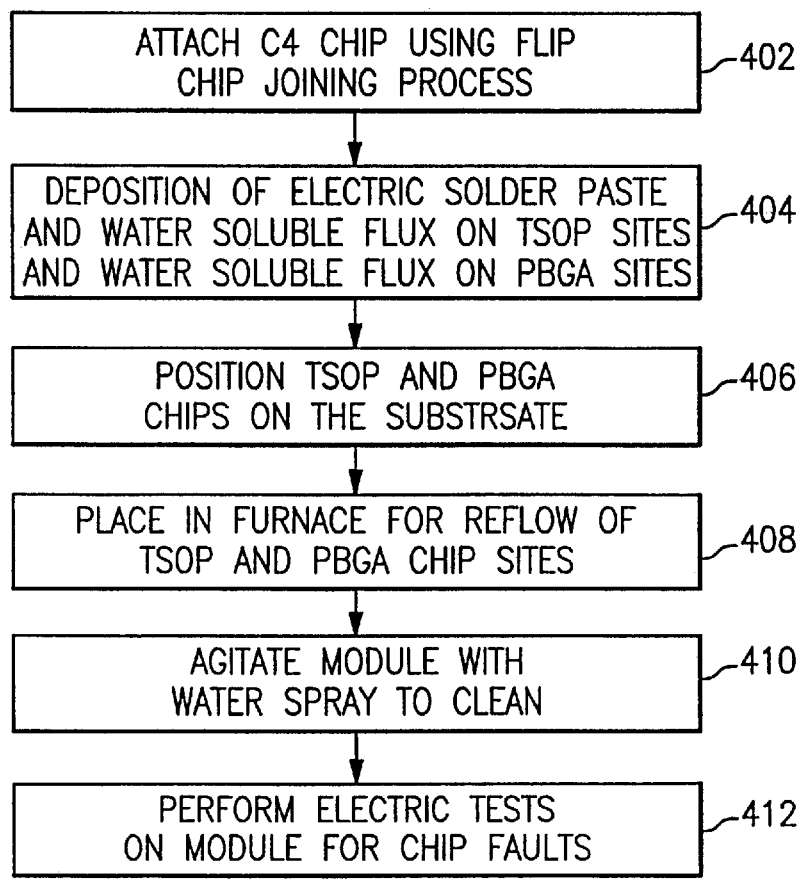
FIG. 4 is a flow diagram of the chip joining processes of the module.

As shown in FIGS. 3 and 4, the C4 chip 102 and the capacitors 104 are joined to the module surface using standard C4 high temperature chip joining procedures using solder of 97% lead, 3% tin and a high temperature reflow process (step 402). The high oven temperatures used to join the C4 chip and the organic solvent, such as xylene, used to clean the rosin flux residue from the chip in these procedures, are incompatible with the plastic components of the TSOP and PBGA chips. Also, standard paste screening techniques fail to provide adequate module yields due to proximity of the chips to one another and unevenness in the top surface of the module substrate resulting from the previous high temperature soldering processing during the C4 chip joining. To solve these problems after testing of the joined C4 chip for mechanical and electrical faults, the sites 202 and 204 for the TSOP chips are dressed with the eutectic solder containing 63% tin and 37% lead in a paste using a nozzle 300 which is positioned over each of the TSOP solder sites 302 and is moved from site to site (step 404). The nozzle is moved from site to site and the amount of solder dispensed is computer controlled so that the motion from site to site and the amount of solder dispensed is varied depending on the type of chip to be attached to the module.

As mentioned previously, the solder paste must be fluid enough for dispensing with the accuracy needed but must be firm enough so that the solder does not run between closely spaced solder sites. Operable ranges for such a solder paste have been set forth previously. The preferred values for the paste within the ranges set forth are: the particle size of the particles in the paste are preferably 425 mesh; the paste preferably has a viscosity of 400K CPS and has a solid content of 82%. A water soluble flux is also placed on both the TSOP locations and PBGA site 206 using the nozzle 300 or alternately sprayed on to the site. The flux can be deposited on the TSOP sites simultaneously with the injection of the solder paste or in a separate operation. As shown in FIG. 4, the TSOP and PBGA chips are then placed in the positions shown in FIG. 1 (step 406) and the module put in a furnace (step 408) for low temperature reflow of the TSOP and PBGA chip sites. After the joining process is complete, the chip is agitated by a stream of deionized water which is used to remove the flux residue left on the module. Once cleaned, the module is electrically tested for mechanical joining and functional faults (step 412). If the module tests good it is ready for use in the ET4 machine of International Business Machines Corporation or other machines using MCM modules.

Figure 5:
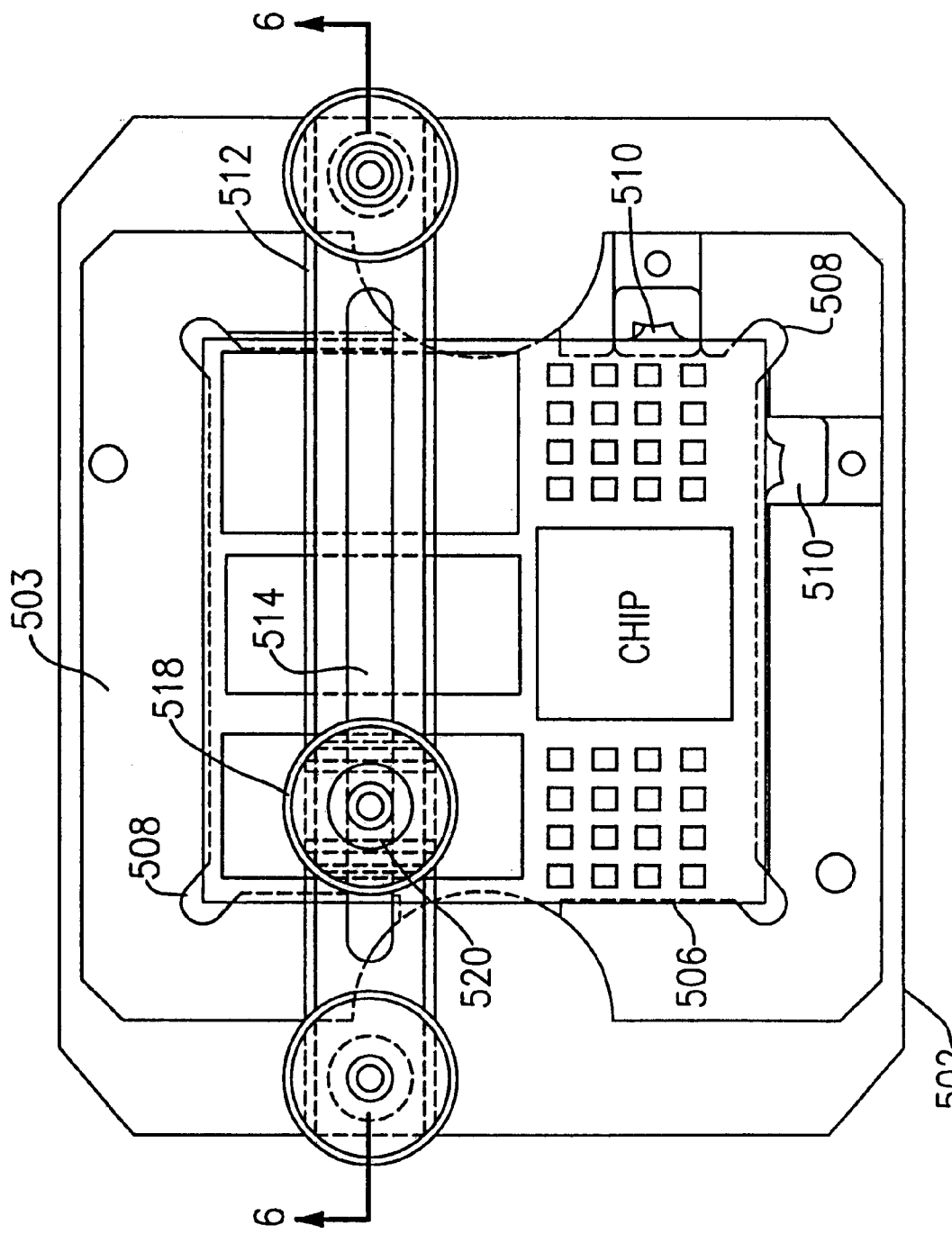
FIG. 5 is a top view of the module in a chip removal and module cleaning fixture.
Figure 6:
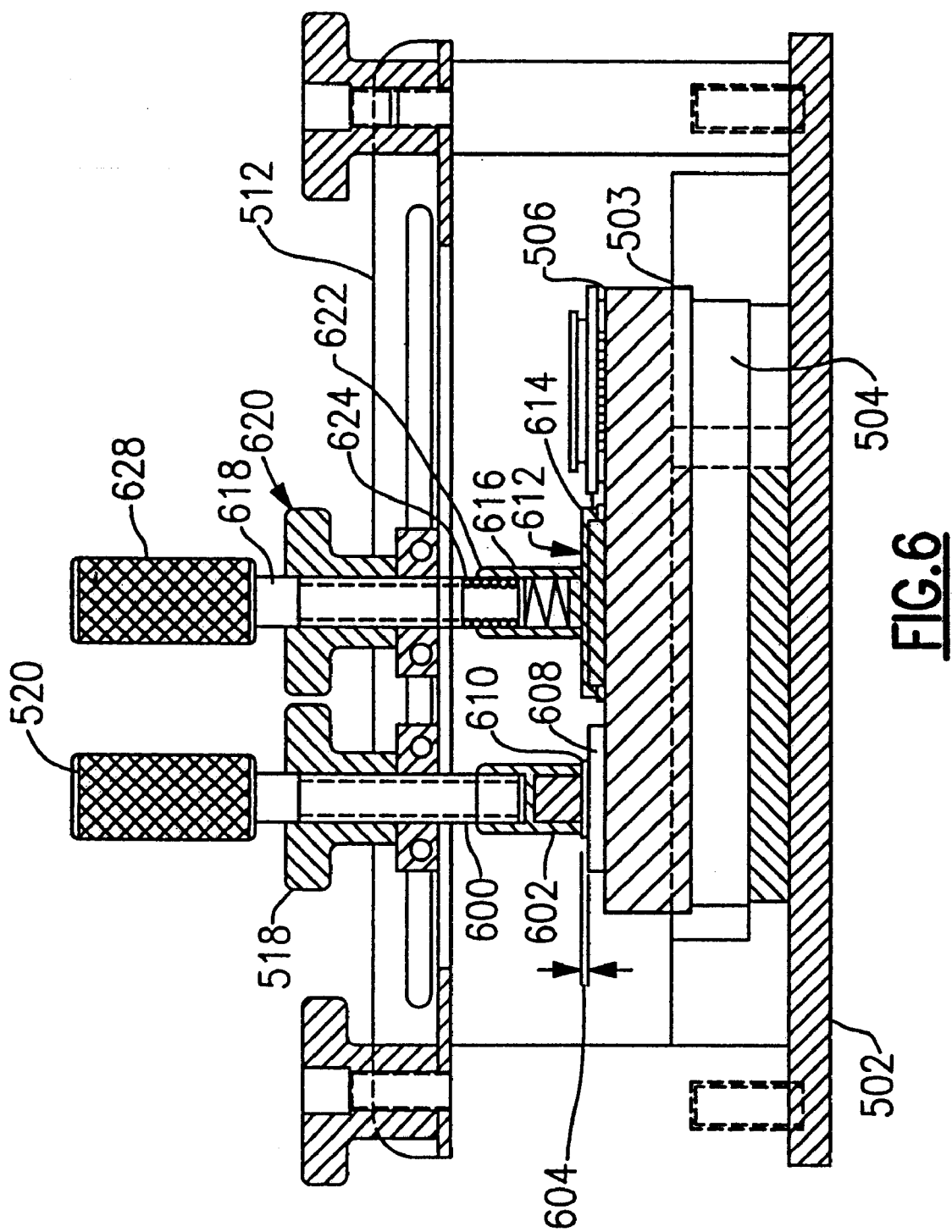
FIG. 6 is a view taken along the line 6—6 of FIG. 5.

If it turns out that the module tests bad resulting from structural or functional problems in one of the TSOP or PBGA chips, that chip is removed using the chip removal jig of FIGS. 5 and 6. As shown the chip removal chip fixture contains a base 502 for receipt of a carrier 503 with a cavity 504 for receipt of the rework module 506. This cavity contains wells 508 on either side of the chip for positioning the rework chip into the jig either by hand or by mechanical means. The base also has springs 510 for clamping the rework module 506 into position within the cavity. Positioned over the cavity on legs is a bridge 512 for suspending a post 600 containing a magnet 602 capable of withstanding high temperature without losing its magnetism. The post is slidable within a slot 514 so that it can be suspended over the chip to be removed. The post is then clamped in position using nut 518 and knurled stem 520 is adjusted to place the magnet in a spaced relationship 604 with the chip 608 to be removed. Prior to such adjustment, iron or another magnetically attracted block 610, is fixed to the chip to be removed by a high temperature glue such as Loctite 326 manufactured by Loctite Corporation. The magnet is then adjusted using the knurled stem 520 to be spaced from the metal block. The module is then placed into the furnace and raised to a temperature that reflows the solder connecting the chip to the top surface of the substrate 506. As the solder melts, the magnetic block lifts the iron block 610 and the chip 608 off the surface of the module leaving the chip site available for future use.

Once the chip has been removed from the site the site must be cleaned to remove solder residue. In the case of the PBGA chip and other chips like it, the solder residue is significant and cannot be effectively removed using a simple copper block. As shown in FIG. 6, to overcome the difficulties encountered using a copper block, the module 506 is again placed into the carrier 503 and a copper block 612 is held to the site to be dressed 614 using spring loaded foot 616 that is held against the block by a post 618 similar to the one previously described in connection with the magnet. The post is positioned over the chip site to be cleaned and clamped there by the nut force exerted by twisting stem 620 is exerted on the foot 616 through a spring 622 captured between the foot 616 and the end of the post 618. As the post moves downwardly, ends of the foot moves in a groove 624 in the post. With the copper block properly positioned, the module is heated in the reflow oven to melt the solder which under pressure exerted by the springs is drawn to the copper block leaving the chip site clean of excess solder.

Above we have described embodiments of the present invention. Of course, a number of variations may be apparent to those skilled in the art. Therefore it should be understand that the present invention is not limited to the described embodiments but encompasses the spirit and scope of the appended claims.

What is claimed is:

1. A method for attachment different types of chips with various reflow requirements to a substrate comprising the steps of:

attaching a chip to the substrate using a high temperature reflow process;

dressing the substrate surface sites for a chip using a low temperature reflow process with a eutectic water based solder with or without the deposition of flux after the high temperature reflow process is complete, said dressing of the surface sites by individual deposition of solder with or without the deposition of flux on solder sites instead of the paste screen processing;

and using a solder with a particle size of between 400 to 500 mesh, a viscosity lower than 500K CPS and solid content of 86% to 80%.

2. The method of claim 1, wherein the particle size is between 400 and 450 mesh.

3. The method of claim 2, wherein the particle size is substantially 425 mesh.

4. The method of claim 3, wherein the viscosity is between 425 and 375 CPS.

5. The method of claim 4, wherein the viscosity is substantially 400 CPS.

6. The method of claim 1, wherein the solid content is between 84 and 80%.

7. The method of claim 6, wherein the solid content is substantially 82%.

8. The method of claim 1, including the step of testing the module after the attachment of the chips with the low reflow requirements to the substrate to determine bad connections to the substrate.

9. The method of claim 8 including the steps of:

removing a chip with bad interconnections to the substrate by placing a magnetically attracted element to the chip to be removed;

suspending a magnetically attracted element to the chip and element in a spaced relationship thereto and heating the module so as solder joining the chip to the substrate melts the chip is drawn up to the magnet by the magnetically attracted element to detach the chip from the substrate.

10. The method of claim 1, wherein the substrate is a ceramic substrate.

11. The method of claim 9 including the step of applying pressure using spring force on a copper block placed on the removed chip site on the substrate to draw excess solder into the copper block.

* * * * *